(12) United States Patent
Sengoku

(10) Patent No.: US 6,219,808 B1
(45) Date of Patent: Apr. 17, 2001

(54) SEMICONDUCTOR DEVICE CAPABLE OF CARRYING OUT HIGH SPEED FAULT DETECTING TEST

(75) Inventor: Shoichiro Sengoku, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/062,733

(22) Filed: Apr. 20, 1998

(30) Foreign Application Priority Data

Apr. 18, 1997 (JP) .................................................. 9-116494

(51) Int. Cl.[7] .................................................. G01R 31/28
(52) U.S. Cl. .............................................. 714/724; 326/81
(58) Field of Search .................................. 714/724, 733, 714/727; 324/158.1; 326/9, 64, 65, 66, 71, 81, 84

(56) References Cited

U.S. PATENT DOCUMENTS

| | | | |
|---|---|---|---|
| 4,506,164 | * | 3/1985 | Higuchi .................................... 326/81 |
| 4,937,826 | * | 6/1990 | Gheewala et al. ....................... 714/724 |
| 5,302,951 | * | 4/1994 | Yamashita ............................... 341/144 |
| 5,383,194 | * | 1/1995 | Sloan et al. ............................. 714/724 |
| 5,459,737 | * | 10/1995 | Andrews ................................. 714/733 |
| 5,621,740 | * | 4/1997 | Kamada .................................. 714/727 |
| 5,671,150 | * | 9/1997 | Maxwell ................................. 364/488 |
| 5,736,849 | * | 4/1998 | Terayama ............................ 324/158.1 |
| 5,744,949 | * | 4/1998 | Whetsel ............................... 324/158.1 |

FOREIGN PATENT DOCUMENTS

| | | |
|---|---|---|
| 63-85941 | 4/1988 | (JP) . |
| 2-266278 | 10/1990 | (JP) . |
| 3-197883 | 8/1991 | (JP) . |
| 4-48277 | 2/1992 | (JP) . |
| 5-90940 | 4/1993 | (JP) . |
| 6-118131 | 4/1994 | (JP) . |
| 7-72219 | 3/1995 | (JP) . |

* cited by examiner

Primary Examiner—Dieu-Minh T. Le
(74) Attorney, Agent, or Firm—Young & Thompson

(57) ABSTRACT

In a semiconductor device including a high power supply line, a low power supply line, and a CMIS gate circuit having a high voltage side terminal, a low voltage side terminal and an output terminal, a first switching element is connected between the high voltage side terminal and the high power supply line, a second switching element is connected to the output terminal and the high power supply line, a third switching element is connected between the low voltage side terminal and the low power supply line, and a fourth switching element is connected to the output terminal and the low power supply line.

14 Claims, 12 Drawing Sheets

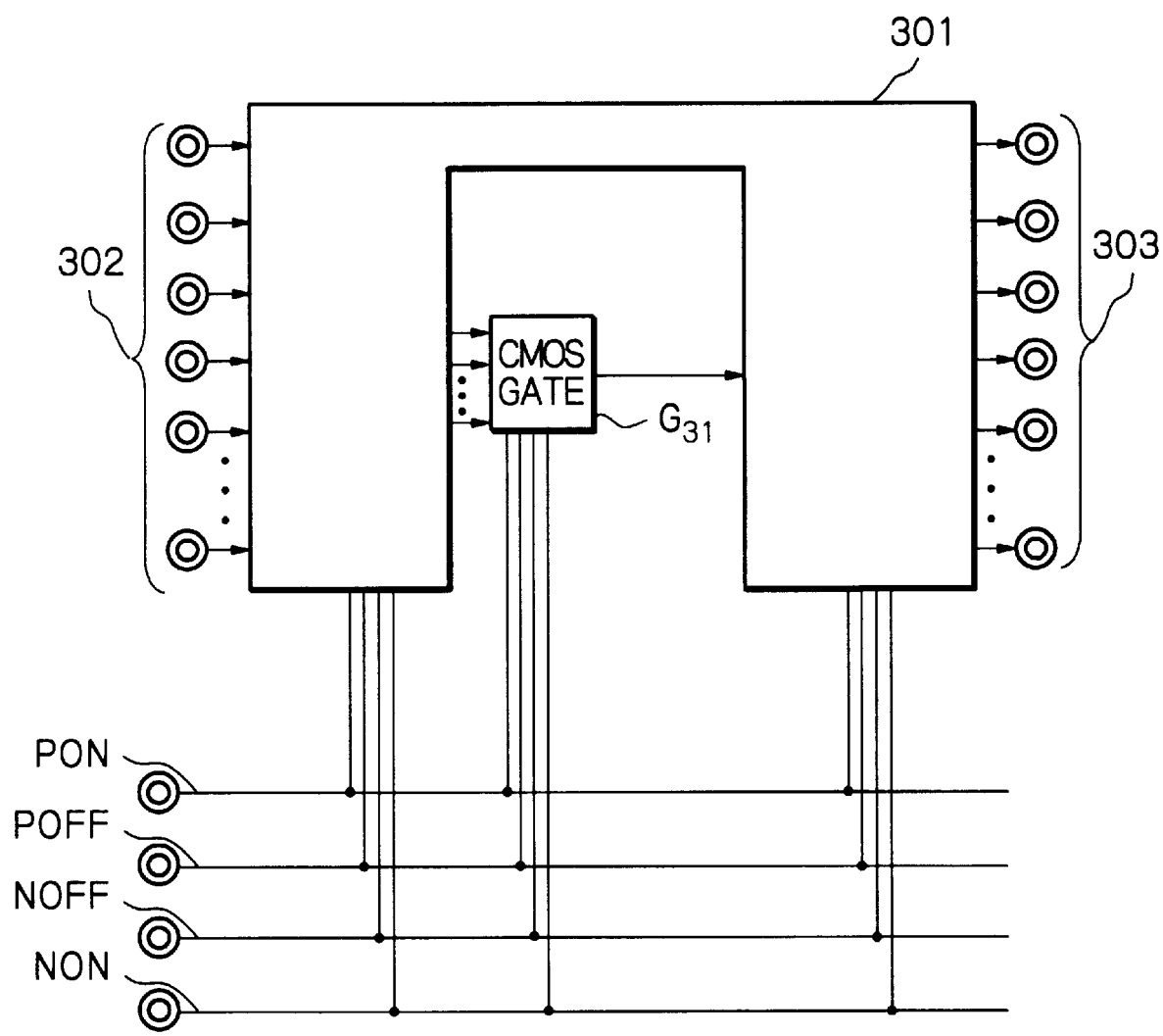

SEMICONDUCTOR DEVICE CAPABLE OF CARRYING OUT HIGH SPEED FAULT DETECTING TEST

BACKGROUND OF THE INVENTION

1. Field of the Invention

The present invention relates to a complementary metal oxide semiconductor (CMOS) device (broadly, complementary metal insulator semiconductor (CMIS) device), and more particularly, to the improvement of a "stuck-at-1" or "stuck-at-0" fault test function thereof.

2. Description of the Related Art

In a prior art system for testing a CMOS device, the device is driven by using a functional test pattern, and as a result, an output pattern is obtained at the outputs of the device. Then, the output pattern is compared with an expected pattern. Thus, a determination of whether or not the device is normal or abnormal is made based on whether or not the output pattern coincides with the expected pattern.

In the above-mentioned prior art system, a fault point such as a "stuck-at-1" fault point or a "stuck-at-0" fault point is estimated. Note that a "stuck-at-1" fault and a "stuck-at-0" fault will be explained later. For this purpose, special test patterns are supplied to external input terminals, thus activating a fault. Then, a plurality of test patterns are further supplied to the external input terminals, so that the activated fault propagates through the CMOS device to reach external output terminals. This will be explained later in detail.

In the above mentioned prior art system, however, when the fault is deactivated within the CMOS device before the activated fault reaches the external output terminals, a plurality of test pattern signals for activating the fault and a plurality of test pattern signals for propagating the activated fault are again supplied to the external input terminals. In addition, as the CMOS device is highly-integrated, the number of test pattern signals for activating and propagating a fault is increased. As a result, it is substantially impossible to effectively detect a fault in a highly integrated CMOS device.

On the other hand, in order to detect a fault in a CMOS device, an $I_{ddq}$ test has been adopted (see JP-A-6-118131). That is, a fault is detected by detecting an abnormal quiescent $V_{DD}$ supply current $I_{ddq}$, i.e., a penetration current flowing within the CMOS device. In the $I_{ddq}$ test, it is unnecessary to propagate the activated fault to the external output terminals.

In the $I_{ddq}$ test, however, since it takes a long time to measure a stable $I_{ddq}$ current, it is impossible to measure all $I_{ddq}$ currents for all possible test pattern signals. Therefore, in order to decrease the $I_{ddq}$ test time, test patterns are limited to measure $I_{ddq}$ currents, or special test patterns for the $I_{ddq}$ test are used. Also, if the test pattern includes a pattern for initializing the CMOS device, it is impossible to detect a new fault. Therefore, the $I_{ddq}$ test cannot increase the rate of detection of faults.

SUMMARY OF THE INVENTION

It is an object of the present invention to provide a CMOS device capable of carrying out a complete fault detecting test at a high speed.

According to the present invention, in a semiconductor device including a high power supply line, a low power supply line, and a CMOS gate circuit having a high voltage side terminal, a low voltage side terminal and an output terminal, a first switching element is connected between the high voltage side terminal and the high power supply line, a second switching element is connected to the output terminal and the high power supply line, a third switching element is connected between the low voltage side terminal and the low power supply line, and a fourth switching element is connected to the output terminal and the low power supply line.

In a normal operation mode, the first and third switching elements are turned ON, and the second and fourth switching elements are turned OFF.

In a "stuck-at-1" fault test mode, the fourth switching element is turned ON, and the first and second switching elements are turned OFF. The third switching element can be turned ON or OFF.

In a "stuck-at-0" fault test mode, the second switching element is turned ON, and the third and fourth switching elements are turned OFF. The first switching element can be turned ON or OFF.

Also, a plurality of CMOS gate circuits are individually subjected to a "fault-at-1" fault test mode or a "fault-at-0" fault test mode, and thus, a "bridge" fault between two of the CMOS gate circuits can be detected. Note that a "bridge" fault is explained later.

BRIEF DESCRIPTION OF THE DRAWINGS

The present invention will be more clearly understood from the description as set forth below, as compared with the prior art, with reference to the accompanying drawings, wherein:

FIG. 9 is a circuit diagram of a generalized CMOS device of the devices of FIGS. 6A and 6B;

DESCRIPTION OF THE PREFERRED EMBODIMENTS

Before the description of the preferred embodiments, prior art CMOS devices will be explained with reference to FIGS. 1A, 1B, 2A, 2B, 3A, 3B, 4A and 4B.

Figure 1A:
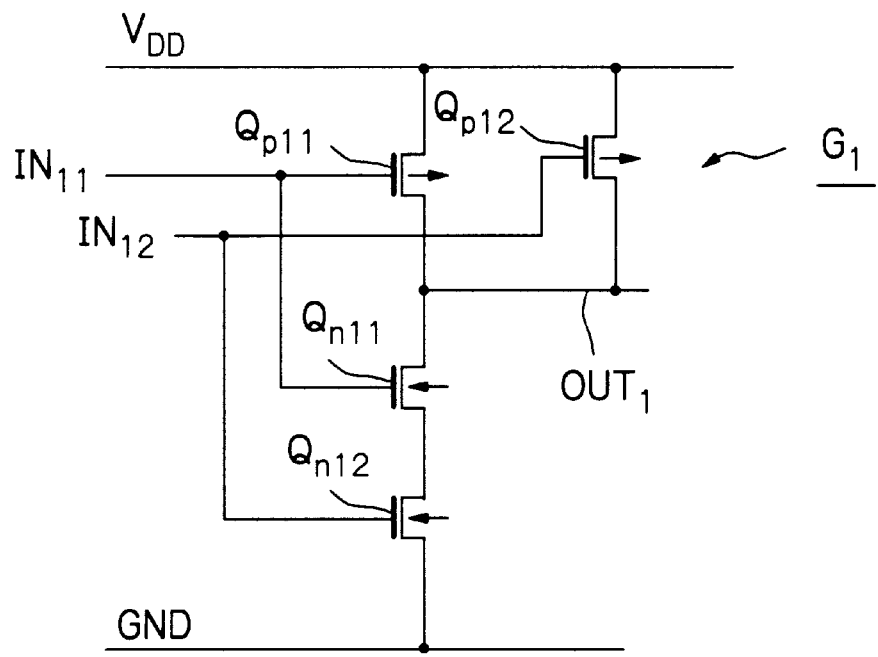
FIG. 1A is a circuit diagram illustrating a prior art two-input CMOS NAND circuit.

In FIG. 1A, which illustrates a prior art two-input input CMOS NAND circuit, P-channel MOS transistors $Q_{p\,1\,1}$ and $Q_{p\,1\,2}$ are connected in parallel between a power supply line $V_{D\,D}$ and an output line $OUT_1$, and N-channel MOS transistors $Q_{n\,1\,1}$ and $Q_{n\,1\,2}$ are connected in series between the output line $OUT_1$ and a ground line GND. An input signal $IN_{1\,1}$ is applied to gates of the transistors $Q_{p\,1\,1}$ and $Q_{n\,1\,1}$, and an input signal $IN_{1\,2}$ is applied to gates of the transistors $Q_{p\,1\,2}$ and $Q_{n\,1\,2}$.

If at least one of the input signals $IN_{1\,1}$ and $IN_{1\,2}$ is low, the voltage at the output line $OUT_1$ is high. On the other hand, if both of the input signals $IN_{1\,1}$ and $IN_{1\,2}$ are high, the voltage at the output $OUT_1$ is low.

Figure 1B:
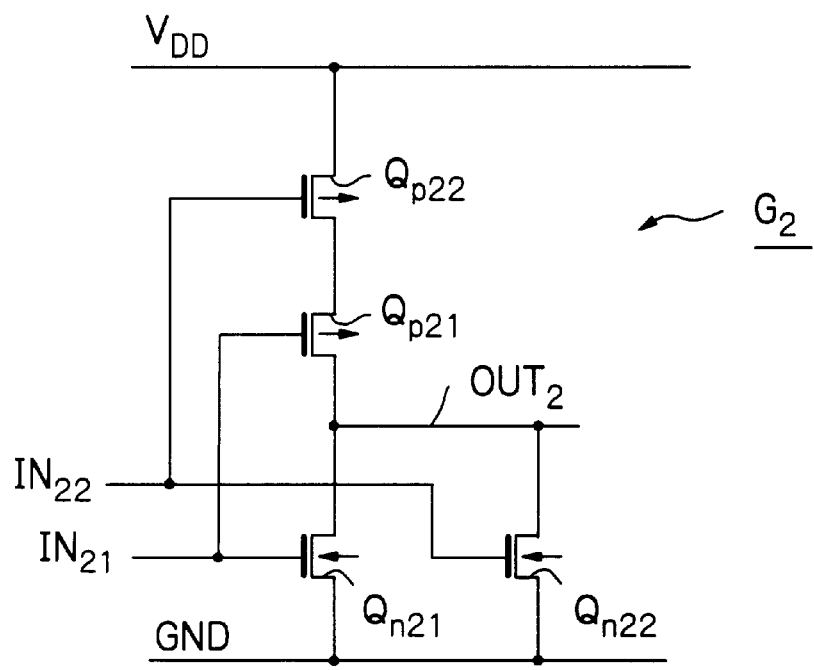
FIG. 1B is a circuit diagram illustrating a prior art two-input CMOS NOR circuit.

In FIG. 1B, which illustrates a prior art two-input CMOS NOR circuit, P-channel MOS transistors $Q_{p\,2\,1}$ and $Q_{p\,2\,2}$ are connected in series between the power supply line $V_{D\,D}$ and an output line $OUT_2$, and N-channel MOS transistors $Q_{n\,2\,1}$ and $Q_{n\,2\,2}$ are connected in parallel between the output line $OUT_2$ and the ground line GND. An input signal $IN_{2\,1}$ is applied to gates of the transistors $Q_{p\,2\,1}$ and $Q_{n\,2\,1}$, and an input signal $IN_{2\,2}$ is applied to gates of the transistors $Q_{p\,2\,2}$ and $Q_{n\,2\,2}$.

If at least one of the input signals $IN_{2\,1}$ and $IN_{2\,2}$ is high, the voltage at the output line $OUT_2$ is low. On the other hand, if both of the input signals $IN_{1\,1}$ and $IN_{1\,2}$ are low, the voltage at the output line $OUT_2$ is high.

Figure 2A:
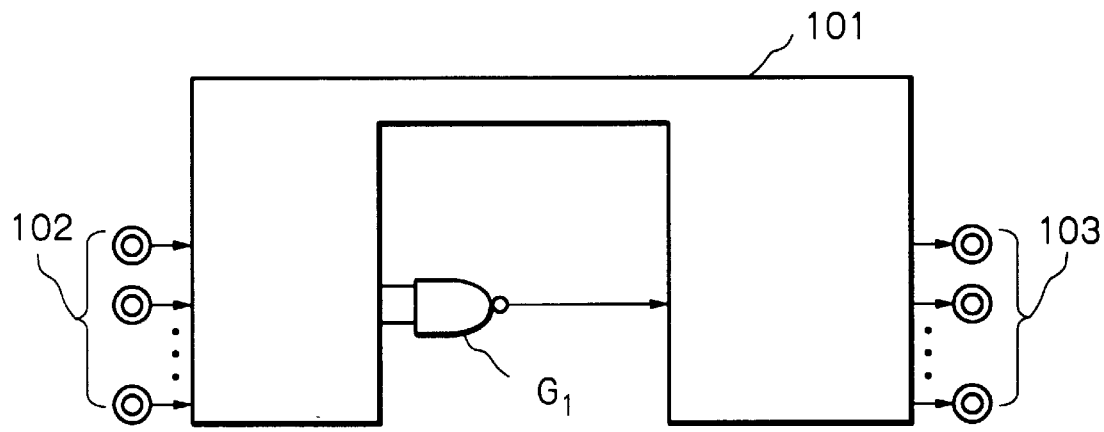
FIG. 2A is a circuit diagram illustrating a first prior art CMOS device including the NAND circuit of FIG. 1A.

In FIG. 2A, which illustrates a first prior art CMOS device, the NAND circuit of FIG. 1A is included as indicated by reference $G_1$. That is, reference numeral 101 designates a sequential circuit/combination circuit connected between external input terminals 102 and external output terminals 103.

Figure 3A:
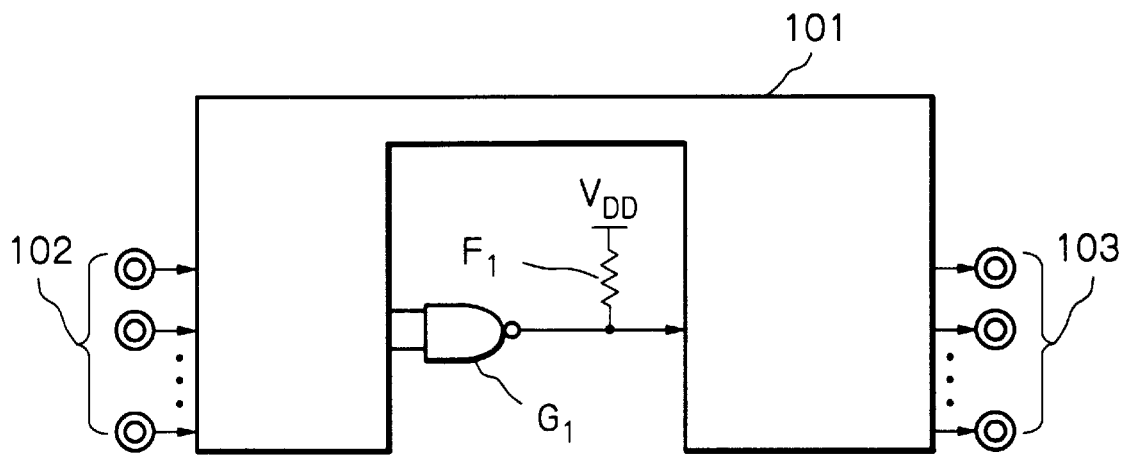
FIG. 3A is a circuit diagram showing a "stuck-at-1" fault in the device of FIG. 2A.

As illustrated in FIG. 3A, if the output of the NAND circuit $G_1$ is short-circuited to the power supply line $V_{D\,D}$, this is called a "stuck-at-1" fault. Note that such a "stuck-at-1" fault can be represented by a resistor $F_1$ having a small resistance connected between the output of the NAND circuit $G_1$ and the power supply line $V_{D\,D}$.

In FIG. 3A, in order to detect a "stuck-at-1" fault, special test pattern signals are supplied to the external input terminals 102, so that the input signals of the NAND circuit $G_1$ are both high. Therefore, a current flows from the power supply line $V_{D\,D}$ via the "stuck-at-1" fault (the resistor $F_1$) to the ground level GND. As a result, the output of the NAND circuit $G_1$ is reversed, thus activating the "stuck-at-1" fault.

Figure 4A:
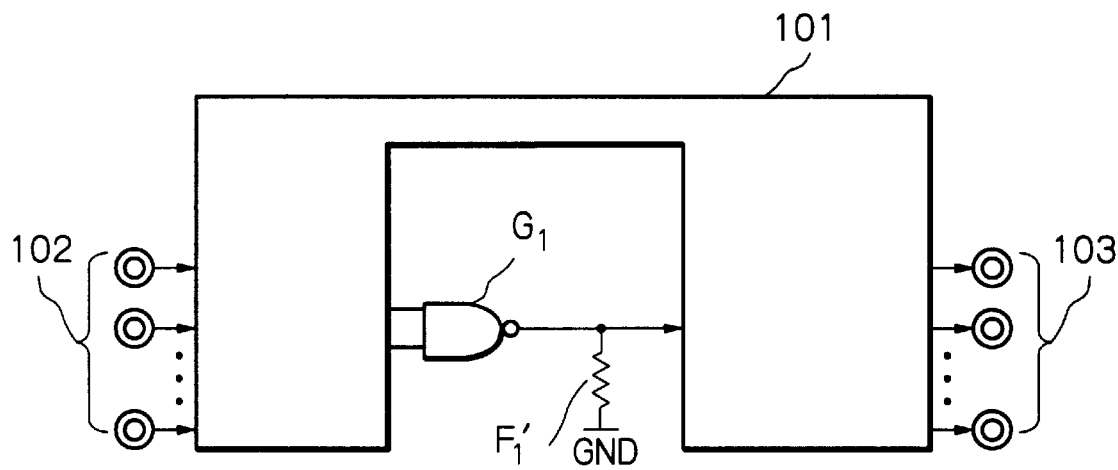
FIG. 4A is a circuit diagram showing a "stuck-at-0" fault in the device of FIG. 2A.

As illustrated in FIG. 4A, if the output of the NAND circuit $G_1$ is short-circuited to the ground line GND, this is called a "stuck-at-0" fault. Note that such a "stuck-at-0" fault can be represented by a resistor $F_1'$ connected between the output of the NAND circuit $G_1$ and the ground line GND.

In FIG. 4A, in order to detect a "stuck-at-0" fault, special test pattern signals are supplied to the external input terminals 102, so that at least one of the input signals of the NAND circuit $G_1$ is low. Therefore, a current flows from the output of the NAND circuit $G_1$ via the "stuck-at-0" fault (the resistor $F_1'$) to the ground level GND. As a result, the output of the NAND circuit $G_1$ is reversed, thus activating the "stuck-at-0" fault.

Figure 2B:
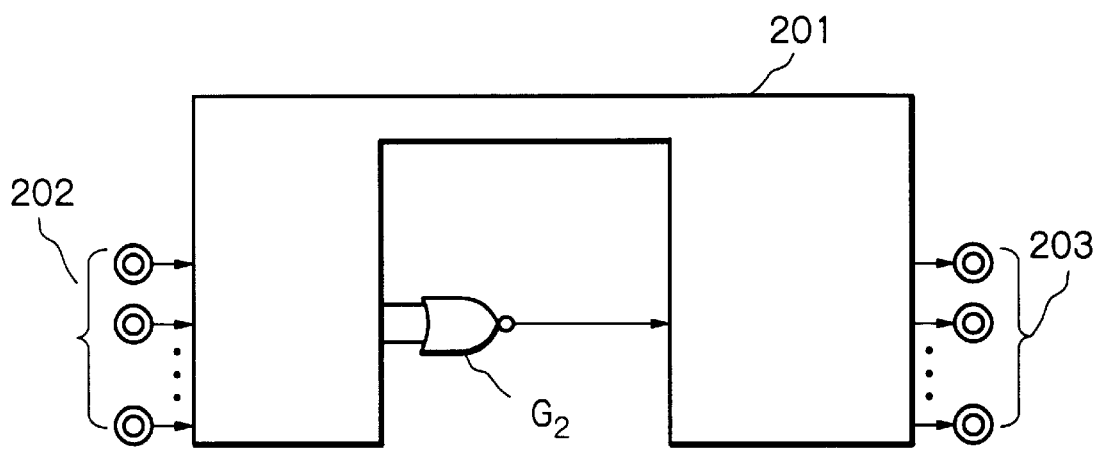
FIG. 2B is a circuit diagram illustrating a second prior art CMOS device including the NAND circuit of FIG. 1B.

In FIG. 2B, which illustrates a second prior art CMOS device, the NOR circuit of FIG. 1B is included as indicated by reference $G_2$. That is, reference numeral 201 designates a sequential circuit/combination circuit connected between external input terminals 202 and external output terminals 203.

Figure 3B:
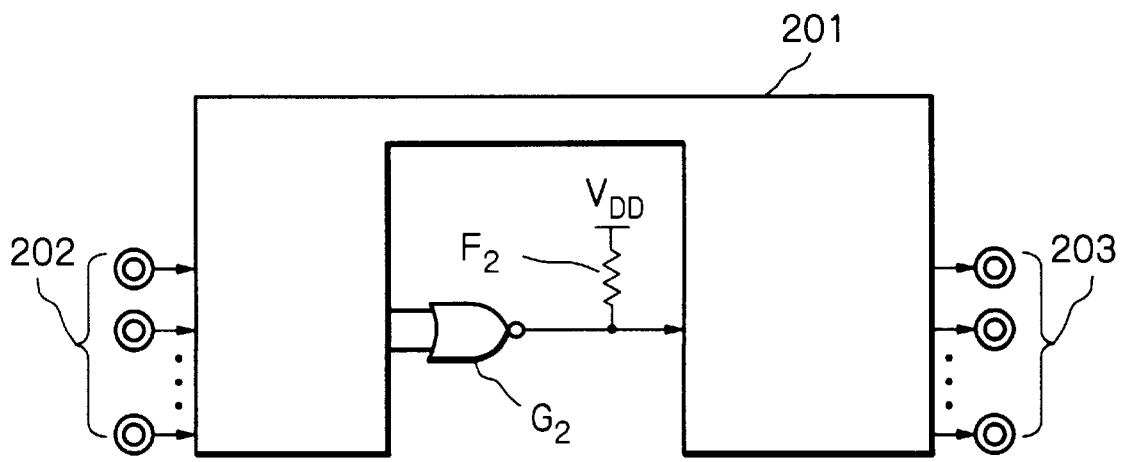
FIG. 3B is a circuit diagram showing a "stuck-at-1" fault in the device of FIG. 2B.

As illustrated in FIG. 3B, if the output of the NOR circuit $G_2$ is short-circuited to the power supply line $V_{D\,D}$, this is also called a "stuck-at-1" fault. Note that such a "stuck-at-1" fault can be represented by a resistor $F_2$ having a small resistance connected between the output of the NOR circuit $G_2$ and the power supply line $V_{D\,D}$.

In FIG. 3B, in order to detect a "stuck-at-1" fault, special test pattern signals are supplied to the external input terminals 202, so that at least one of the input signals of the NOR circuit $G_2$ is high. Therefore, a current flows from the power supply line $V_{D\,D}$ via the "stuck-at-1" fault (the resistor $F_2$) to the ground level GND. As a result, the output of the NOR circuit $G_2$ is reversed, thus activating the "stuck-at-1" fault.

Figure 4B:
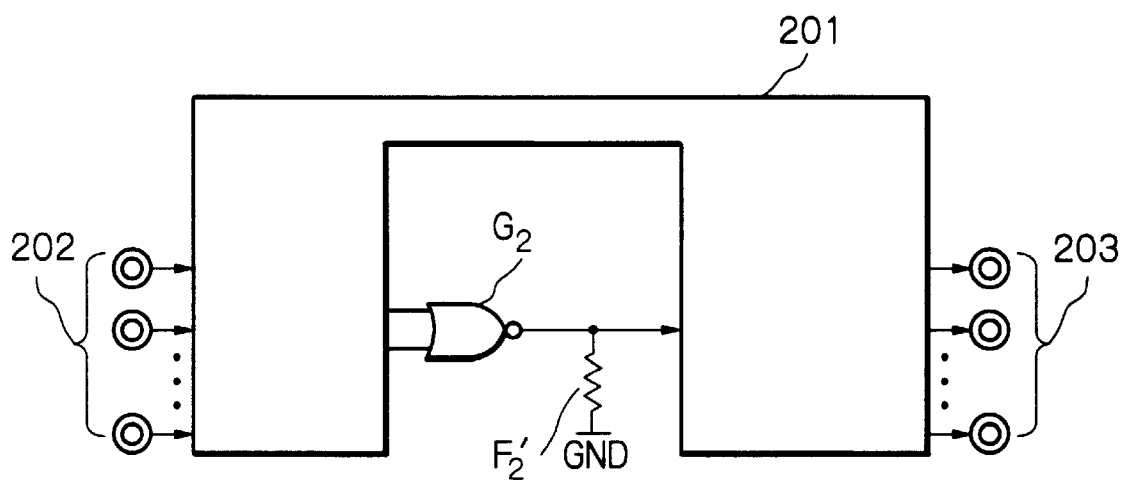
FIG. 4B is a circuit diagram showing a "stuck-at-0" fault in the device of FIG. 2B.

As illustrated in FIG. 4B, if the output of the NOR circuit $G_2$ is short-circuited to the ground line GND, this is also called a "stuck-at-0" fault. Note that such a "stuck-at-0" fault can be represented by a resistor $F_2'$ connected between the output of the NOR circuit $G_2$ and the ground line GND.

In FIG. 4B, in order to detect a "stuck-at-0" fault, special test pattern signals are supplied to the external input terminals 202, so that the input signals of the NOR circuit $G_1$ are both low. Therefore, a current flows from the output of the NOR circuit $G_2$ via the "stuck-at-0" fault (the resistor $F_2'$) to the ground level GND. As a result, the output of the NOR circuit $G_2$ is reversed, thus activating the "stuck-at-0" fault.

In FIGS. 3A, 3B, 4A and 4B, in order to detect the "stuck-at-1" or "stuck-at-0" fault, a plurality of test pattern signals are further supplied to the external input terminals 102 or 202, so that the "stuck-at-1" or "stuck-at-0" fault propagates through the sequential circuit/combination circuit 101 or 201 to reach the external output terminals 103 or 203.

In FIGS. 3A, 3B, 4A and 4B, however, when the "stuck-at-1" or "stuck-at-0" fault is deactivated within the sequential circuit/combination circuit 101 or 201 before the "stuck-at-1" or "stuck-at-0" fault reaches the external output terminals 103 or 203, a plurality of test pattern signals for activating the "stuck-at-1" or "stuck-at-0" fault and a plurality of test pattern signals for propagating the activated "stuck-at-1" or "stuck-at-0" fault are again supplied to the external input terminals 102 or 202. In addition, as the CMOS device is highly-integrated, the number of test pattern signals for activating and propagating a "stuck-at-1" or "stuck-at-0" fault is increased. As a result, it is substantially impossible to effectively detect a "stuck-at-1" or "stuck-at-0" fault in a highly integrated CMOS device.

On the other hand, in order to detect a fault in a CMOS device, an $I_{d\,d\,q}$ test has been adopted. That is, a fault is detected by detecting an abnormal quiescent $V_{D\,D}$ supply current $I_{d\,d\,q}$, i.e., a penetration current flowing within the CMOS device. For example, in the device of FIGS. 3A and 3B, if a "stuck-at-1" fault is activated, an abnormal $I_{ddq}$ current from the power supply line $V_{DD}$ to the ground line GND. Such an abnormal $I_{ddq}$ current can be detected by a current detector connected to the power supply line $V_{DD}$ or the ground line GND. Also, in the device of FIGS. 4A and 4B, if a "stuck-at-0" fault is activated, an abnormal $I_{ddq}$ current flow from the power supply line $V_{DD}$ to the ground line GND. Such an abnormal $I_{ddq}$ current can be detected by a current detector connected to the power supply line $V_{DD}$ or the ground line $V_{DD}$. In the $I_{ddq}$ test, it is unnecessary to propagate the activated fault to the external output terminals 103 or 203.

In the $I_{ddq}$ test, however, since it takes a long time to measure a stable $I_{ddq}$ current, it is impossible to measure all $I_{ddq}$ currents for all possible test pattern signals. Therefore, in order to decrease the $I_{ddq}$ test time, test pattern signals are limited to limit measure $I_{ddq}$ currents, or special test pattern signals for the $I_{ddq}$ test are used. This cannot increase the rate of detection of fault points.

Figure 5A:
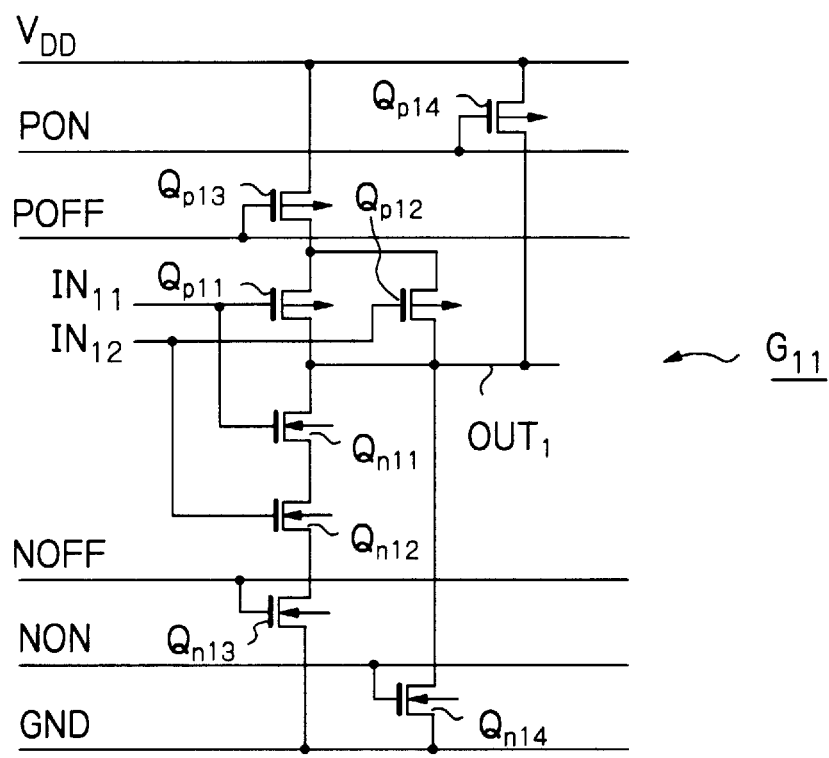
FIG. 5A is a circuit diagram illustrating a two-input CMOS NAND circuit according to the present invention.

In FIG. 5A, which illustrates a two-input CMOS NAND circuit according to the present invention, a P-channel MOS transistor $Q_{p13}$ connected between the sources of the P-channel MOS transistors $Q_{p11}$ and $Q_{p12}$ and the power supply line $V_{DD}$, a P-channel MOS transistor $Q_{p14}$ connected between the output line $OUT_1$ and the power supply line $V_{DD}$, an N-channel MOS transistor $Q_{n13}$ connected between the source of the N-channel MOS transistor $Q_{n12}$ and the ground line GND, and an N-channel MOS transistor $Q_{n14}$ connected between the output line $OUT_1$ and the ground line GND are added to the elements of the NAND circuit of FIG. 1A. The gate of the transistor $Q_{p13}$ is controlled by the voltage at a control line POFF, the gate of the transistor $Q_{p14}$ is controlled by the voltage at a control line PON, the gate of the transistor $Q_{n13}$ is controlled by the voltage at a control line NOFF, and the gate of the transistor $Q_{n14}$ is controlled by the voltage at a control line NON.

In a normal operation mode, the voltage at the control line POFF is low (=GND) and the voltage at the control NOFF is high (=$V_{DD}$), so that the transistors $Q_{p13}$ and $Q_{n13}$ are turned ON. On the other hand, the voltage at the control line PON is high (=$V_{DD}$) and the voltage at the control line NON is low (=GND), so that the transistors $Q_{p14}$ and $Q_{n14}$ are turned OFF.

In a "stuck-at-1" fault test mode, the voltage at the control line NON is high (=$V_{DD}$), so that the transistor $Q_{n14}$ is turned ON. On the other hand, the voltages at the control lines POFF and PON are high (=$V_{DD}$), so that the transistors $Q_{p13}$ and $Q_{p14}$ are turned OFF. In this case, the voltage at the control line NOFF may be high or low, so that the transistor $Q_{n13}$ is turned ON or OFF, which does not affect the "stuck-at-1" fault test mode.

In a "stuck-at-0" fault test mode, the voltage at the control line PON is low (=GND), so that the transistor $Q_{p14}$ is turned ON. On the other hand, the voltages at the control lines NOFF and NON are low (=GND), so that the transistors $Q_{n13}$ and $Q_{n14}$ are turned OFF. In this case, the voltage at the control line POFF may be low or high, so that the transistor $Q_{p13}$ is turned ON or OFF, which does not affect the "stuck-at-0" fault test mode.

Figure 5B:
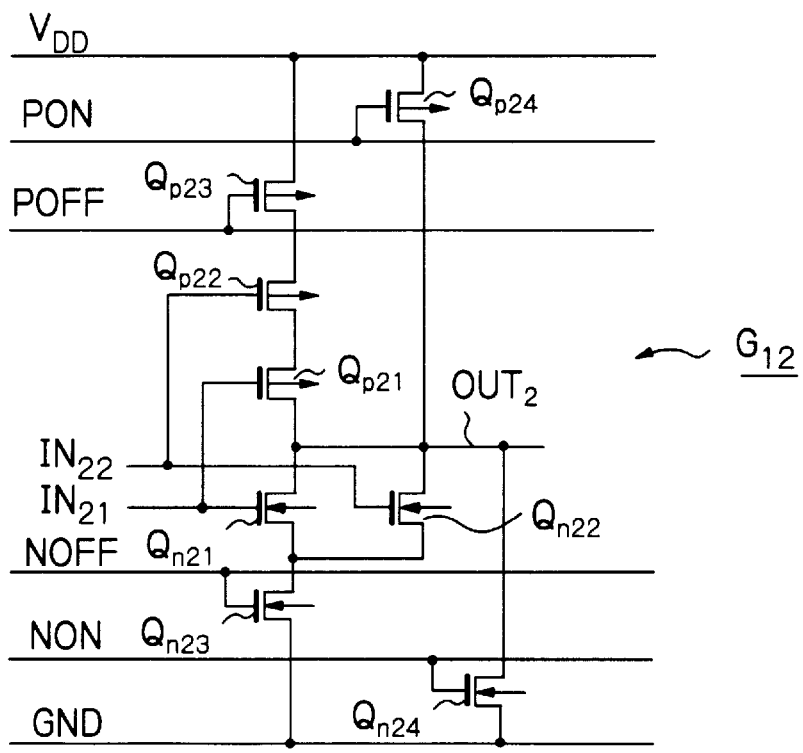
FIG. 5B is a circuit diagram illustrating a two-input CMOS NOR circuit according to the present invention.

In FIG. 5B, which illustrates a two-input CMOS NOR circuit according to the present invention, a P-channel MOS transistor $Q_{p23}$ connected between the source of the P-channel MOS transistor $Q_{p22}$ and the power supply line $V_{DD}$, a P-channel MOS transistor $Q_{p24}$ connected between the output line $OUT_2$ and the power supply line $V_{DD}$, an N-channel MOS transistor $Q_{n23}$ connected between the sources of the N-channel MOS transistors $Q_{n11}$ and $Q_{n12}$ and the ground line GND, and an N-channel MOS transistor $Q_{n24}$ connected between the output line $OUT_2$ and the ground line GND are added to the elements of the NOR circuit of FIG. 1B. The gate of the transistor $Q_{p23}$ is controlled by the voltage at the control line POFF, the gate of the transistor $Q_{p24}$ is controlled by the voltage at the control line PON, the gate of the transistor $Q_{n23}$ is controlled by the voltage at the control line NOFF, and the gate of the transistor $Q_{n24}$ is controlled by the voltage at the control line NON.

In a normal operation mode, the voltage at the control line POFF is low (=GND) and the voltage at the control NOFF is high (=$V_{DD}$), so that the transistors $Q_{p23}$ and $Q_{n23}$ are turned ON. On the other hand, the voltage at the control line PON is high (=$V_{DD}$) and the voltage at the control line NON is low (=GND), so that the transistors $Q_{p24}$ and $Q_{n24}$ are turned OFF.

In a "stuck-at-1" fault test mode, the voltage at the control line NON is high (=$V_{DD}$), so that the transistor $Q_{n24}$ is turned ON. On the other hand, the voltages at the control lines POFF and PON are high (=$V_{DD}$), so that the transistors $Q_{p23}$ and $Q_{p24}$ are turned OFF. In this case, the voltage at the control line NOFF may be high or low, so that the transistor $Q_{n23}$ is turned ON or OFF, which does not affect the "stuck-at-1" fault test mode.

In a "stuck-at-0" fault test mode, the voltage at the control line PON is low (=GND), so that the transistor $Q_{p24}$ is turned ON. On the other hand, the voltages at the control lines NOFF and NON are low (=GND), so that the transistors $Q_{n23}$ and $Q_{n24}$ are turned OFF. In this case, the voltage at the control line POFF may be low or high, so that the transistor $Q_{p23}$ is turned ON or OFF, which does not affect the "stuck-at-0" fault test mode.

Figure 6A:
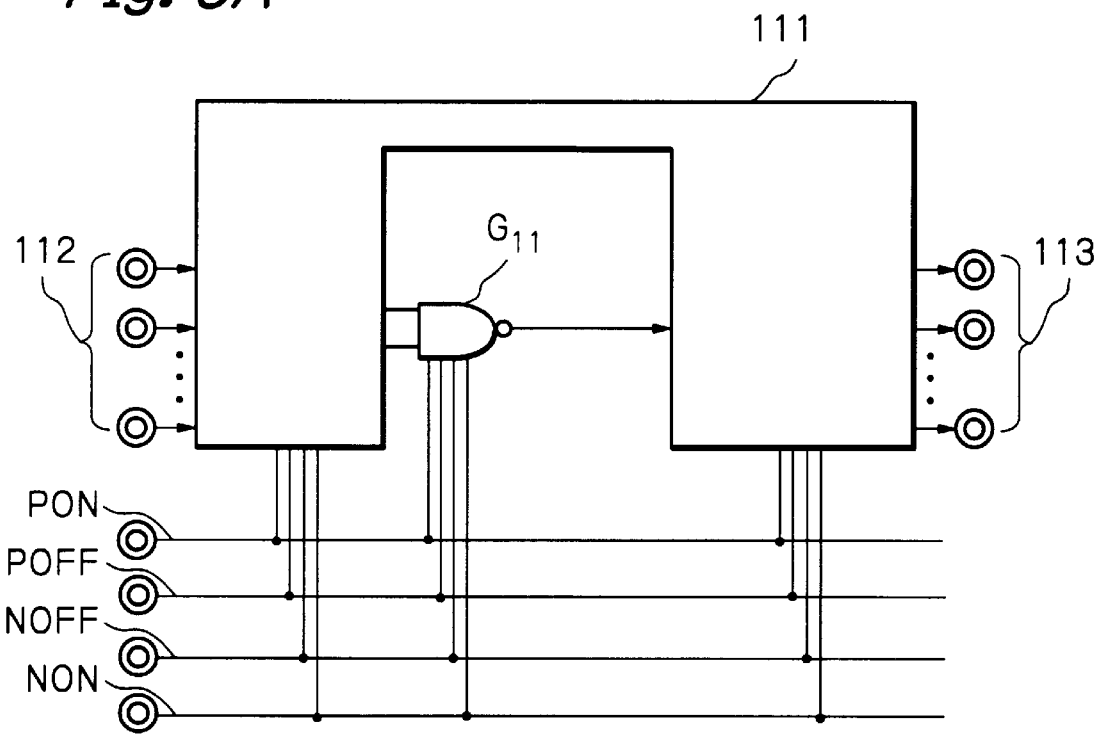
FIG. 6A is a circuit diagram illustrating a first embodiment of the CMOS device including the NAND circuit of FIG. 5A according to the present invention.

In FIG. 6A, which illustrates a first embodiment of the CMOS device according to the present invention, the NAND circuit of FIG. 5A is included as indicated by reference $G_{1\,1}$. That is, reference numeral 111 designates a sequential circuit/combination circuit connected between external input terminals 112 and external output terminals 113.

In a normal operation mode, the voltages at the control lines POFF and PON are low (=GND) and high (=$V_{DD}$), respectively, and the voltages at the control lines NOFF and NON are high (=$V_{DD}$) and low (=GND), respectively.

Figure 7A:
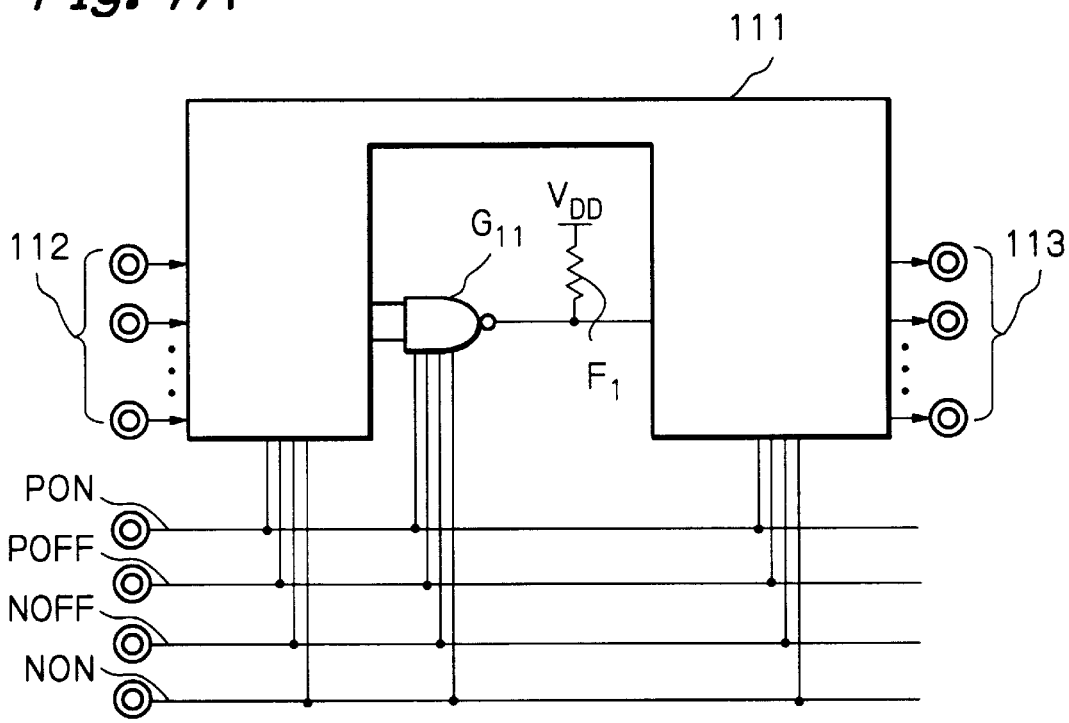
FIG. 7A is a circuit diagram showing a "stuck-at-1" fault in the device of FIG. 6A.

As illustrated in FIG. 7A, if the output of the NAND circuit $G_{1\,1}$ is short-circuited to the power supply line $V_{DD}$, this is called a "stuck-at-1" fault. Note that such a "stuck-at-1" fault can be represented by a resistor $F_1$ having a small resistance connected between the output of the NAND circuit $G_{1\,1}$ and the power supply line $V_{DD}$.

In FIG. 7A, in order to detect a "stuck-at-1" fault, the voltage at the control line NON is high (=$V_{DD}$), and the voltage at the control lines POFF and PON are high (=$V_{DD}$). As a result a current flows from the power supply line $V_{DD}$ via the "stuck-at-1" fault (the resistor $F_1$) to the ground level GND. Such a current flowing through a "stuck-at-1" fault can be detected by a current detector (not shown) connected to the power supply line $V_{DD}$ or the ground line GND.

Figure 8A:
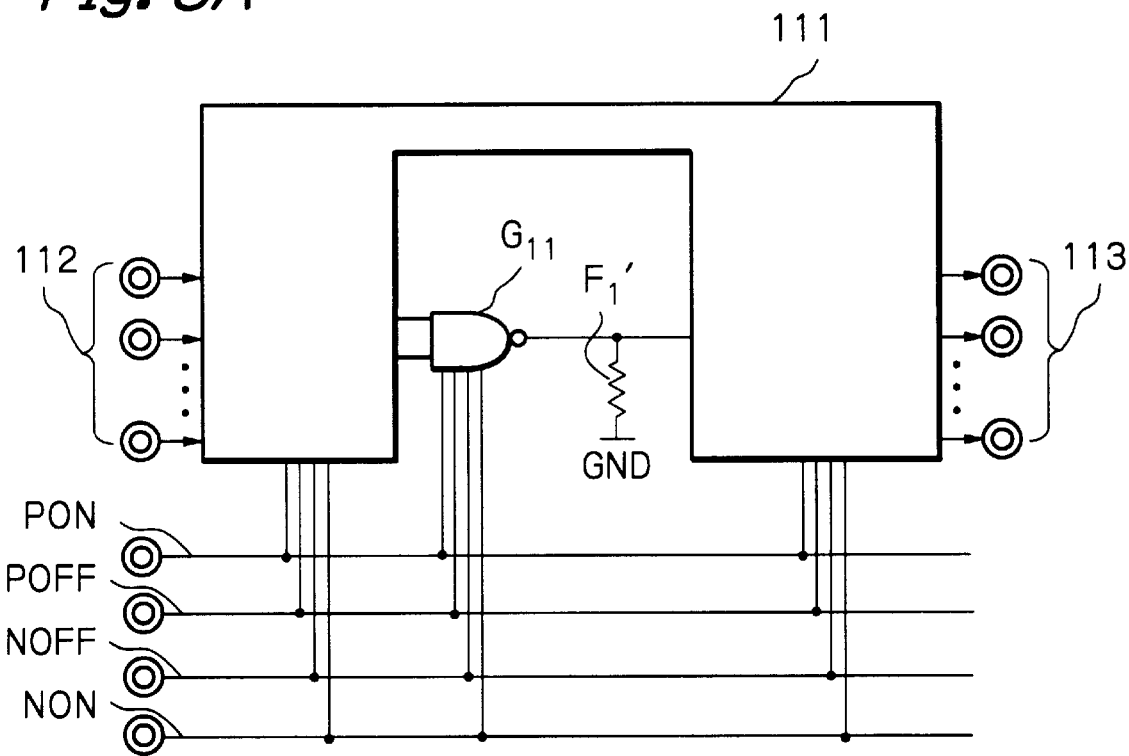
FIG. 8A is a circuit diagram showing a "stuck-at-0" fault in the device of FIG. 7A.

As illustrated in FIG. 8A, if the output of the NAND circuit $G_{1\,1}$ is short-circuited to the ground line GND, this is called a "stuck-at-0" fault. Note that such a "stuck-at-0" fault can be represented by a resistor $F_1'$ having a small resistance connected between the output of the NAND circuit $G_{1\,1}$ and the ground line GND.

In FIG. 8A, in order to detect a "stuck-at-0" fault, the voltage at the control line PON is low (=GND), and the voltage at the control lines NOFF and NON are low (=GND). As a result, a current flows from the output of the NAND circuit $G_1$ via the "stuck-at-0" fault (the resistor $F'_1$) to the ground level GND. Such a current flowing through a "stuck-at-0" fault can be detected by a current detector (not shown) connected to the power supply line $V_{DD}$ or the ground line GND.

Figure 6B:
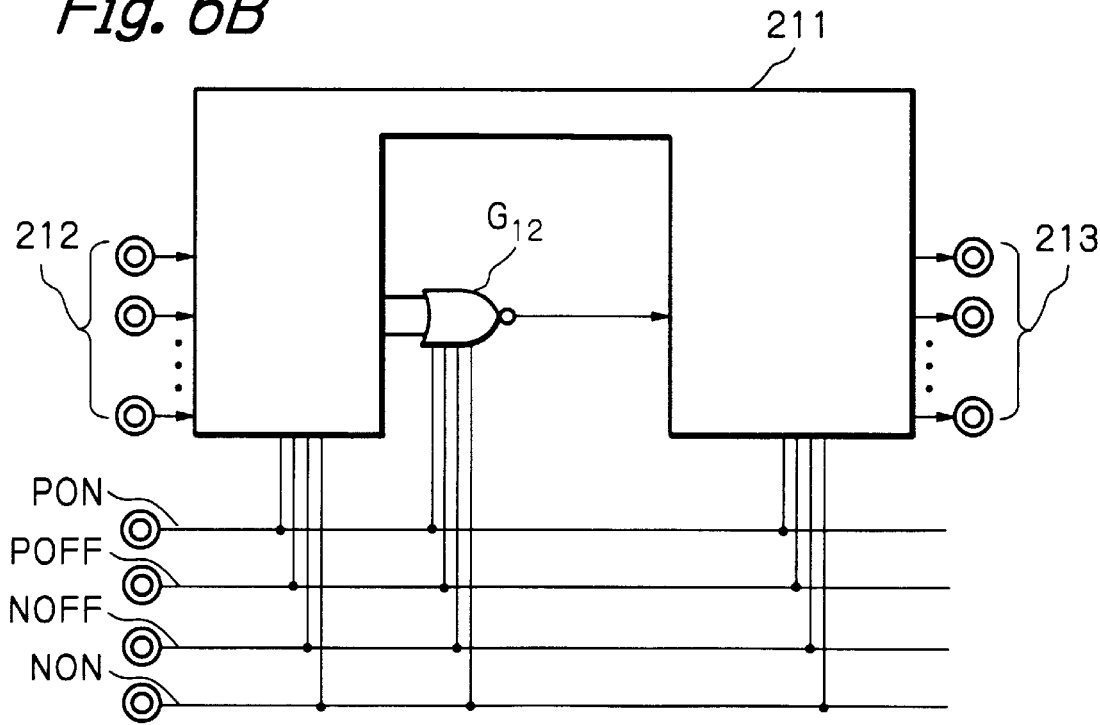
FIG. 6B is a circuit diagram illustrating a second embodiment of the CMOS device including the NAND circuit of FIG. 5B according to the present invention.

In FIG. 6B, which illustrates a second embodiment of the CMOS device according to the present invention, the NOR circuit of FIG. 5B is included as indicated by reference $G_{1\,2}$. That is, reference numeral 211 designates a sequential circuit/combination circuit connected between external input terminals 212 and external output terminals 213.

In a normal operation mode, the voltages at the control lines POFF and PON are low (=GND) and high (=$V_{DD}$), respectively, and the voltages at the control lines NOFF and NON are high (=$V_{DD}$) and low =GND), respectively.

Figure 7B:
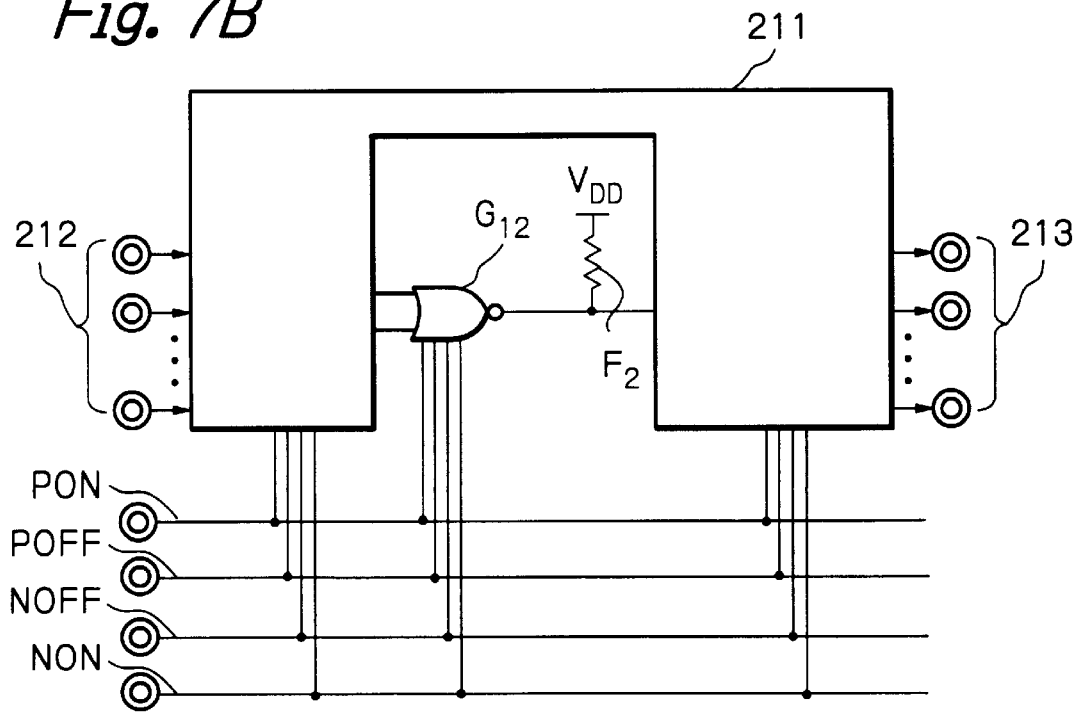
FIG. 7B is a circuit diagram showing a "stuck-at-1" fault in the device of FIG. 6B.

As illustrated in FIG. 7B, if the output of the NOR circuit $G_{1\,2}$ is short-circuited to the power supply line $V_{DD}$, this is called a "stuck-at-1" fault. Note that such a "stuck-at-1" fault can be represented by a resistor $F_2$ having a small resistance connected between the output of the NOR circuit $G_{1\,2}$ and the power supply line $V_{DD}$.

In FIG. 7B, in order to detect a "stuck-at-1" fault, the voltage at the control line NON is high (=$V_{DD}$), and the voltages at the control lines POFF and PON are high (=$V_{DD}$). As a result, a current flows from the power supply line $V_{DD}$ via the "stuck-at-1" fault (the resistor $F_2$) to the ground level GND. Such a current flowing through a "stuck-at-1" fault can be detected by a current detector (not shown) connected to the power supply line $V_{DD}$ or the ground line GND.

Figure 8B:
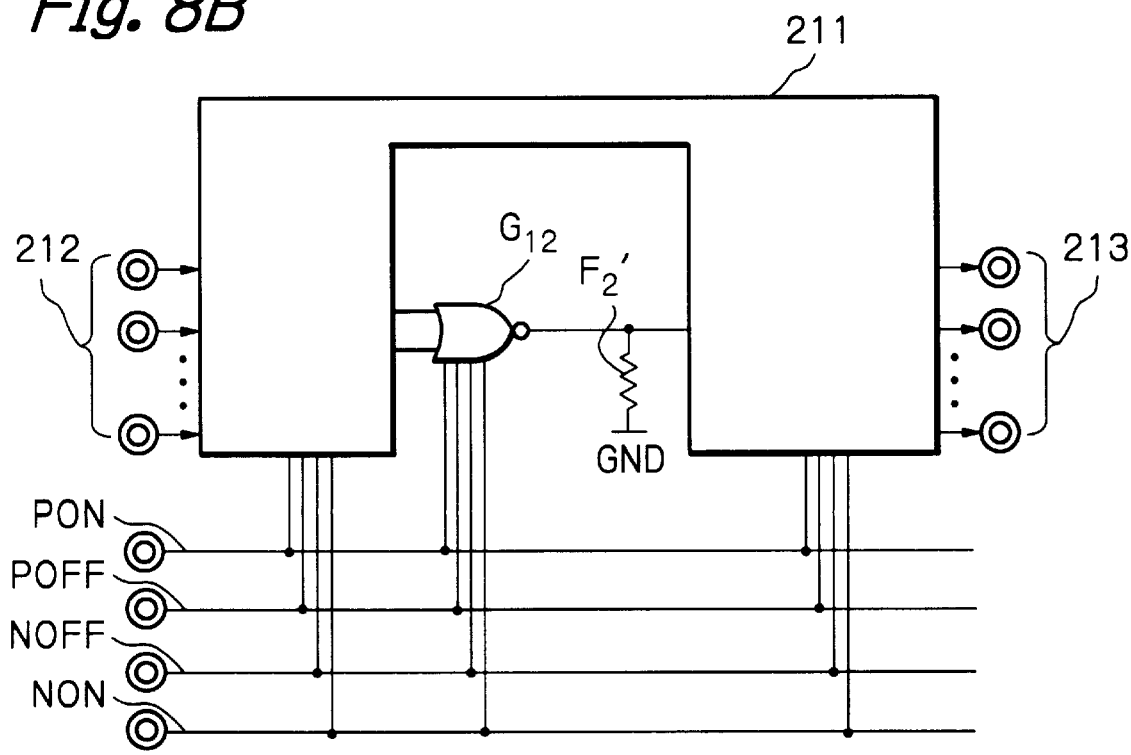
FIG. 8B is a circuit diagram showing a "stuck-at-0" fault in the device of FIG. 7B.

As illustrated in FIG. 8B, if the output of the NOR circuit $G_{1\,2}$ is short-circuited to the ground line GND, this is called a "stuck-at-0" fault. Note that such a "stuck-at-0" fault can be represented by a resistor $F_2'$ having a small resistance connected between the output of the NOR circuit $G_{1\,2}$ and the ground line GND.

In FIG. 8B, in order to detect a "stuck-at-0" fault, the voltage at the control line PON is low (=GND), and the voltages at the control lines NOFF and NON are low (=GND). As a result, a current flows from the output of the NAND circuit $G_1$ via the "stuck-at-0" fault (the resistor $F_1'$) to the ground level GND. Such a current flowing through a "stuck-at-0" fault can be detected by a current detector (not shown) connected to the power supply line $V_{DD}$ or the ground line GND.

In FIG. 9, which illustrates a circuit diagram of a generalized CMOS device of the CMOS devices of FIGS. 6A and 6B, reference numeral 301 designates a sequential circuit/combination circuit connected between external input terminals 302 and external output terminals 303. Also, a CMOS logic gate circuit $G_{3\,1}$ is formed by the NAND circuit $G_{1\,1}$ of FIG. 5A or the NOR circuit $G_{1\,2}$ of FIG. 5B. In this case, the CMOS logic gate circuit $G_{3\,1}$ is formed by an n-bit input NAND circuit or an n-bit input NOR circuit (n=3, 4, . . . ) having the control lines PON, POFF, NON and NOFF. Generally, a "stuck-at-1" fault of the CMOS logic gate circuit $G_{3\,1}$ can be detected by causing the voltage at the control lines NON, PON and POFF to be high (=$V_{DD}$), and a "stuck-at-0" fault of the CMOS logic gate circuit $G_{3\,1}$ can be detected by causing the voltages at the control lines PON, NON and NOFF to be low (=GND).

Figure 10:
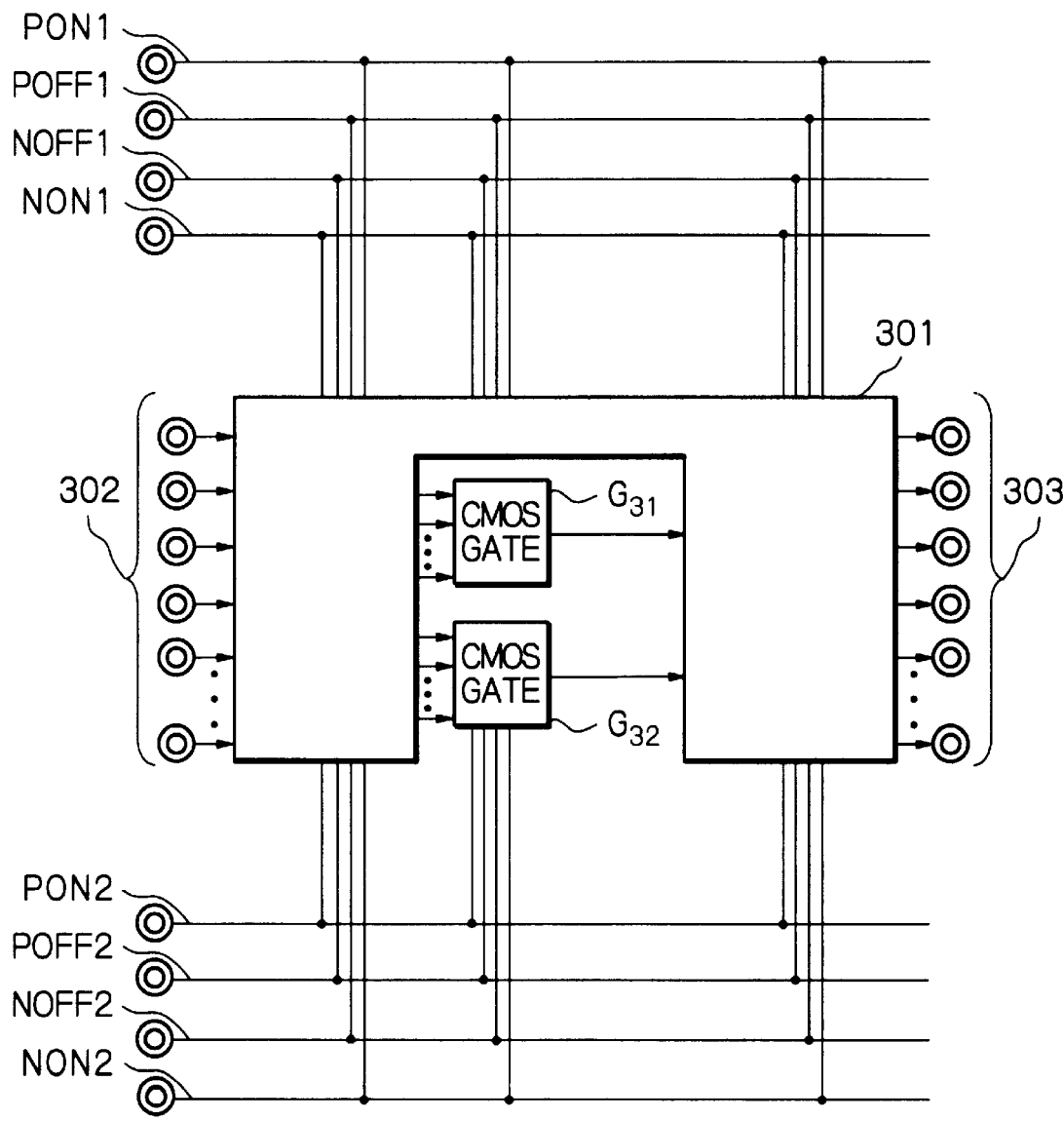
FIG. 10 is a circuit diagram illustrating a third embodiment of the CMOS device according to the present invention.

In FIG. 10, which illustrates a third embodiment of the CMOS device according to the present invention, two kinds of CMOS logic gate circuits $G_{3\,1}$ and $G_{3\,2}$ are provided. In FIG. 10, reference numeral 301 designates a sequential circuit/combination circuit connected between external input terminals 302 and external output terminals 303.

The CMOS logic gate circuit $G_{3\,1}$ is controlled by the voltages at control lines PON1, POFF1, NON1 and NOFF1, and the CMOS logic gate circuit $G_{3\,2}$ is controlled by the voltages at control lines PON2, POFF2, NON2 and NOFF2. Therefore, a "stuck-at-1" fault of the CMOS logic gate circuit $G_{3\,1}$ can be detected by causing the voltage at the control lines NON1, PON1, and POFF1 to be high (=$V_{DD}$), and a "stuck-at-0" fault of the CMOS logic gate circuit $G_{3\,1}$ can be detected by causing the voltages at the control lines PON1, NON1 and NOFF1 to be low (=GND). On the other hand, a "stuck-at-1" fault of the CMOS logic gate circuit $G_{3\,2}$ can be detected by causing the voltage at the control line NON2, PON2 and POFF2 to be high (=$V_{DD}$), and a "stuck-at-0" fault of the CMOS logic gate circuit $G_{3\,2}$ can be detected by causing the voltages at the control lines PON2, NON2 and NOFF2 to be low (=GND).

Figure 11:
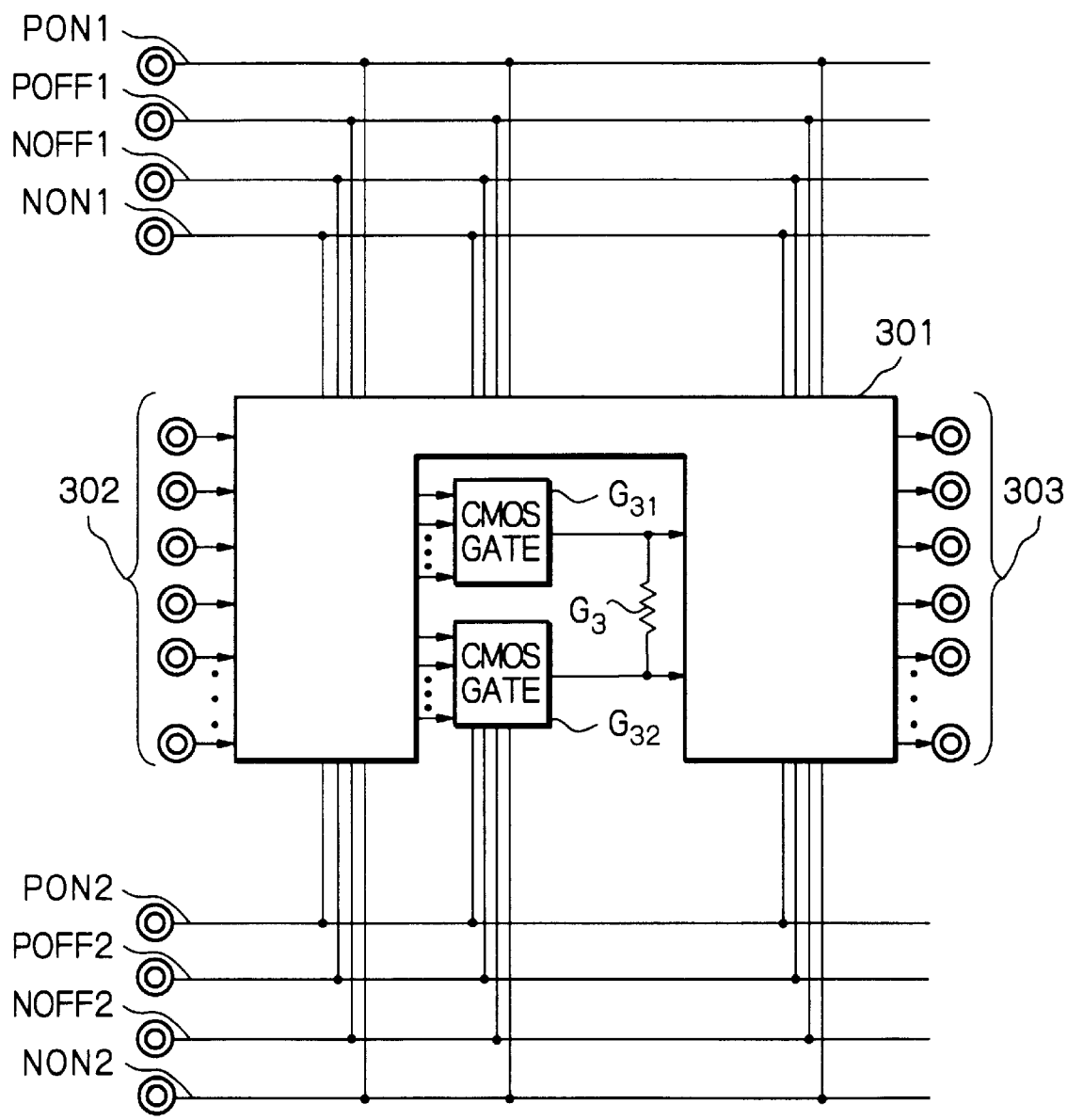
FIG. 11 is a circuit diagram showing a "bridge" fault in the device of FIG. 10.

In FIG. 10, a "bridge" fault between the CMOS logic gate circuits $G_{3\,1}$ and $G_{3\,2}$ can be detected. That is, as illustrated in FIG. 11, if the output of the CMOS logic circuit $G_{3\,1}$ is short-circuited to the output of the CMOS logic gate circuit $G_{3\,2}$, this is called a "bridge" fault. Note that such a "bridge" fault can be represented by a resistor $F_3$ having a small resistance connected between the outputs of the CMOS logic circuits $G_{3\,1}$ and $G_{3\,2}$.

In FIG. 11, in order to detect a "bridge" fault, the voltages at the control lines NON1, PON1 and POFF1 to be high (=$V_{DD}$) and the voltage at the control lines PON2, NON2, and NOFF2 to be low (=GND). Therefore, the voltage at the output of the CMOS logic gate circuit $G_{3\,1}$ is low (=GND) and the voltage at the output of the CMOS logic gate circuit $G_{3\,2}$ is high (=$V_{DD}$). As a result, a current flows from the power supply line $V_{DD}$ via the "bridge" fault (the resistor $F_3$) to the ground line GND. Such a current as a "bridge" fault can be detected by a current detector (not shown) connected to the power supply line $V_{DD}$ or the ground line GND. Similarly, the voltages at the control lines NON1, PON1 and POFF1 to be low (=GND) and the voltages at the control lines PON2, NON2 and NOFF2 to be high (=$V_{DD}$). Therefore, the voltage at the output of the CMOS logic gate circuit $G_{3\,1}$ is high (=$V_{DD}$) and the voltage at the output of the CMOS logic gate circuit $G_{3\,2}$ is low (=GND). As a result, a current flows from the power supply line $V_{DD}$ via the "bridge" fault (the resistor $F_3$) to the ground line GND. Such a current as a "bridge" fault can be detected by a current detector (not shown) connected to the power supply line $V_{DD}$ or the ground line GND.

Figure 12:
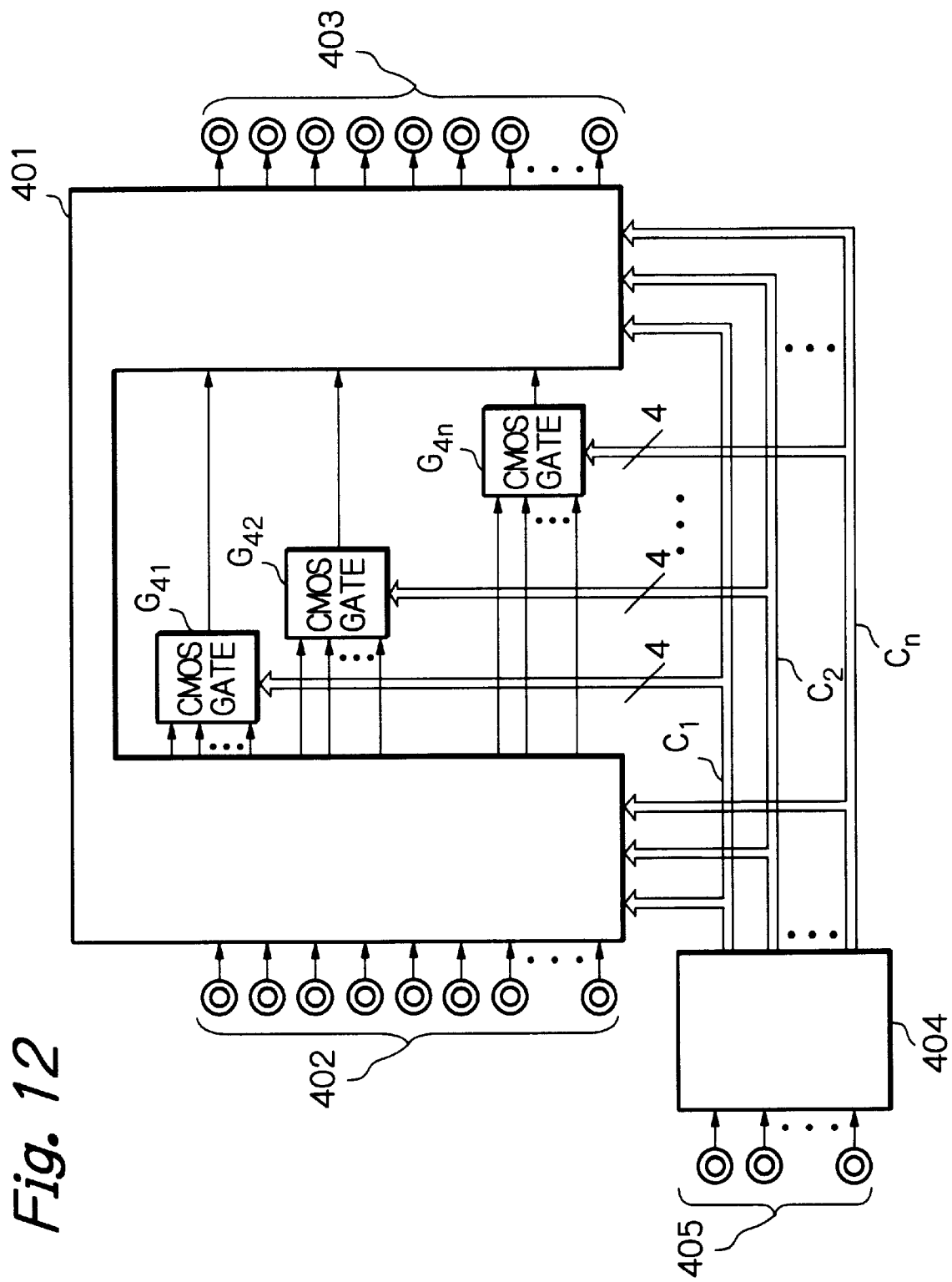
FIG. 12 is a circuit diagram illustrating a fourth embodiment of the CMOS device according to the present invention.

In FIG. 12, which illustrates a fourth embodiment of the CMOS device according to the present invention, n kinds (n=3, 4, . . . ) of CMOS logic gate circuits $G_{4\,1}, G_{4\,2}, \ldots G_{4\,n}$ are provided. In FIG. 12, reference numeral 401 designates a sequential circuit/combination circuit connected between external input terminals 402 and external output terminals 403.

The CMOS logic gate circuit $G_{4\,i}$ (i=1, 2, . . . , n) is controlled by a control signal $C_i$ (the voltages at control lines PONi, POFFi, NONi and NOFFi). The control signal $C_i$ is generated from a test signal control circuit 404 which is connected to external test terminals 405.

In each of the CMOS logic gate circuit $G_{4\,1}, G_{4\,2}, \ldots, G_{4\,n}$, a "stuck-at-1" or "stuck-at-0" fault can be detected in the same way as in the fifth embodiment. Also, in two of the CMOS logic gate circuits $G_{4\,1}, G_{4\,2}, \ldots G_{4\,n}$, a "bridge" fault can be detected in the same way as in the third embodiment.

Note that the test signal control circuit 404 can be of a decoder type, to thereby reduce the number of the external test terminals 405.

In the above-mentioned embodiments, although a definite number of CMOS logic gate circuits are excluded from the sequence circuit/combination circuit, all the CMOS logic gate circuits included therein are subjected to detection of a "stuck-at-1" fault, a "stuck-at-0" fault or a "bridge" fault according to the present invention.

As explained hereinabove, according to the present invention, a "stuck-at-1" or "stuck-at-0" fault can be detected without activating and propagating such a "stuck-at-1" or "stuck-at-0" fault by supplying special test pattern signals to the external input terminals, thus decreasing the test time. In addition, a "bridge" fault can be detected without supplying special test pattern signals to the external input terminals, which also can decrease the test time.

What is claimed is:

1. A semiconductor device comprising:
    a high power supply line;
    a low power supply line;
    a CMIS gate circuit having a high voltage side terminal, a low voltage side terminal and an output terminal;
    a first switching element connected between said high voltage side terminal and said high power supply line;
    a second switching element connected to said output terminal and said high power supply line;
    a third switching element connected between said low voltage side terminal and said low power supply line; and
    a fourth switching element connected to said output terminal and said low power supply line.

2. The device as set forth in claim 1, further comprising:
    a first control line, connected to said first switching element, for turning ON said first switching element in a normal operation mode and turning OFF said first switching element in a "stuck-at-1" fault test mode;
    a second control line, connected to said second switching element, for turning ON said second switching element in a "stuck-at-0" fault test mode and turning OFF said second switching element in said normal operation mode and said "stuck-at-1" fault test mode;
    a third control line, connected to said third switching element, for turning ON said third switching element in said normal operation mode and turning OFF said third switching element in said "stuck-at-0" fault test mode; and
    a fourth control line, connected to said fourth switching element, for turning ON said fourth switching element in said "stuck-at-1" fault test mode and turning OFF said fourth switching element in said normal operation mode and said "stuck-at-0" fault test mode.

3. The device as set forth in claim 2, further comprising external test terminals connected to said first, second, third and fourth control lines.

4. The device as set forth in claim 3, further comprising a test signal control circuit connected between said external test terminals and said first, second, third and fourth control lines.

5. The device as set forth in claim 1, wherein each of said first and second switching elements comprises a P-channel MIS transistor,
    each of said third and fourth switching elements comprising an N-channel MIS transistor.

6. A semiconductor device comprising:
    a high power supply line;
    a low power supply line;
    a plurality of CMIS gate circuits each having a high voltage side terminal, a low voltage side terminal and an output terminal;
    a plurality of first switching elements each connected between said high voltage side terminal of one of said CMIS gate circuits and said high power supply line;
    a plurality of second switching elements each connected to said output terminal of one of said CMIS gate circuits and said high power supply line;
    a plurality of third switching elements each connected between said low voltage side terminal of one of said CMIS gate circuits and said low power supply line; and
    a plurality of fourth switching elements each connected to said output terminal of one of said CMIS gate circuits and said low power supply line.

7. The device as set forth in claim 6, further comprising:
    a plurality of first control lines, each connected to one of said first switching elements, for turning ON said one of said first switching elements in a normal operation mode and turning OFF said one of said first switching elements in a "stuck-at-1" fault test mode;
    a plurality of second control lines, each connected to one of said second switching elements, for turning ON said one of said second switching elements in a "stuck-at-0" fault test mode and turning OFF said one of said second switching elements in said normal operation mode and said "stuck-at-1" fault test mode;
    a plurality of third control lines, each connected to one of said third switching elements, for turning ON said one of said third switching elements in said normal operation mode and turning OFF said one of said third switching elements in said "stuck-at-0" fault test mode; and
    a plurality of fourth control lines, each connected to one of said fourth switching elements, for turning ON said one of said fourth switching elements in said "stuck-at-1" fault test mode and turning OFF said one of said fourth switching elements in said normal operation mode and said "stuck-at-0" fault test mode.

8. The device as set forth in claim 7, further comprising external test terminals connected to said first, second, third and fourth control lines.

9. The device as set forth in claim 8, further comprising a test signal control circuit connected between said external test terminals and said first, second, third and fourth control lines.

10. The device as set forth in claim 6, wherein each of said first and second switching elements comprises a P-channel MIS transistor,
    each of said third and fourth switching elements comprising an N-channel MIS transistor.

11. The device as set forth in claim 6, wherein one of said CMIS gate circuits is caused to be in a "stuck-at-1" fault test mode and another of said CMIS gate circuits is caused to be in a "stuck-at-0" fault test mode, so that a "bridge" fault test is carried out between said one of said CMIS gate circuits and said other of said CMIS gate circuits.

12. A complementary metal insulator ("CMIS") gate circuit with a fault test circuit, comprising:
    a CMIS gate circuit having a high voltage side terminal, a low voltage side terminal, and an output terminal;
    a first switching transistor directly connected between said high voltage side terminal and a high power supply line;

a second switching transistor directly connected to said output terminal and the high power supply line;

a third switching transistor directly connected between said low voltage side terminal and a low power supply line;

a fourth switching transistor directly connected to said output terminal and the low power supply line.

13. The device as set forth in claim 12, further comprising:

a first control line, connected to said first switching transistor, for turning ON said first switching element in a normal operation mode of said CMIS gate circuit and turning OFF said first switching element in a "stuck-at-1" fault test mode;

a second control line, connected to said second switching transistor, for turning ON said second switching element in a "stuck-at-0" fault test mode and turning OFF said second switching transistor in said normal operation mode and said "stuck-at-1" fault test mode;

a third control line, connected to said third switching transistor, for turning ON said third switching element in said normal operation mode and turning OFF said third switching transistor in said "stuck-at-0" fault test mode; and a fourth control line, connected to said fourth switching transistor, for turning ON said fourth switching transistor in said "stuck-at-1" fault test mode and turning OFF said fourth switching transistor in said normal operation mode and said "stuck-at-0" fault test mode.

14. The device as set forth in claim 12, wherein each of said first and second switching transistors comprise a p-channel MIS transistor, each of said third and fourth switching transistors comprising an N-channel MIS transistor; and where the high power line is $V_{DD}$ and the low power line is ground.

* * * * *